United States Patent [19]

Ekholm

[11] 4,412,307
[45] Oct. 25, 1983

[54] MAGNETIC BUBBLE DETECTOR

[75] Inventor: David T. Ekholm, Bethlehem Township, Hunterdon County, N.J.

[73] Assignee: Bell Telephone Laboratories, Incorporated, Murray Hill, N.J.

[21] Appl. No.: 305,129

[22] Filed: Sep. 24, 1981

[51] Int. Cl.³ .............................................. G11C 19/08
[52] U.S. Cl. .......................................... 365/8; 365/36
[58] Field of Search ..................................... 365/8, 36

[56] References Cited

U.S. PATENT DOCUMENTS 3,729,726  4/1973  Bobeck .................... 340/174 TF
3,810,132  5/1974  Bobeck .................... 340/174 EB
4,360,904  11/1982  Gergis ............................. 365/36

OTHER PUBLICATIONS

Journal of Applied Physics—vol. 53, No. 3, Mar. 1982 pp. 2525–2527.
The Bell System Technical Journal—Feb. 1980, pp. 229–257.

Primary Examiner—James W. Moffitt
Attorney, Agent, or Firm—Herbert M. Shapiro

[57] ABSTRACT

A magnetic bubble detector for an ion-implanted bubble memory is achieved by using a permalloy detector element and two conductors. The conductors are operative first to stretch a bubble from one position in a bubble path and then to destretch it, after detection, from the detector element to another position in the path. The detector has been operated at 100 kilohertz.

6 Claims, 7 Drawing Figures

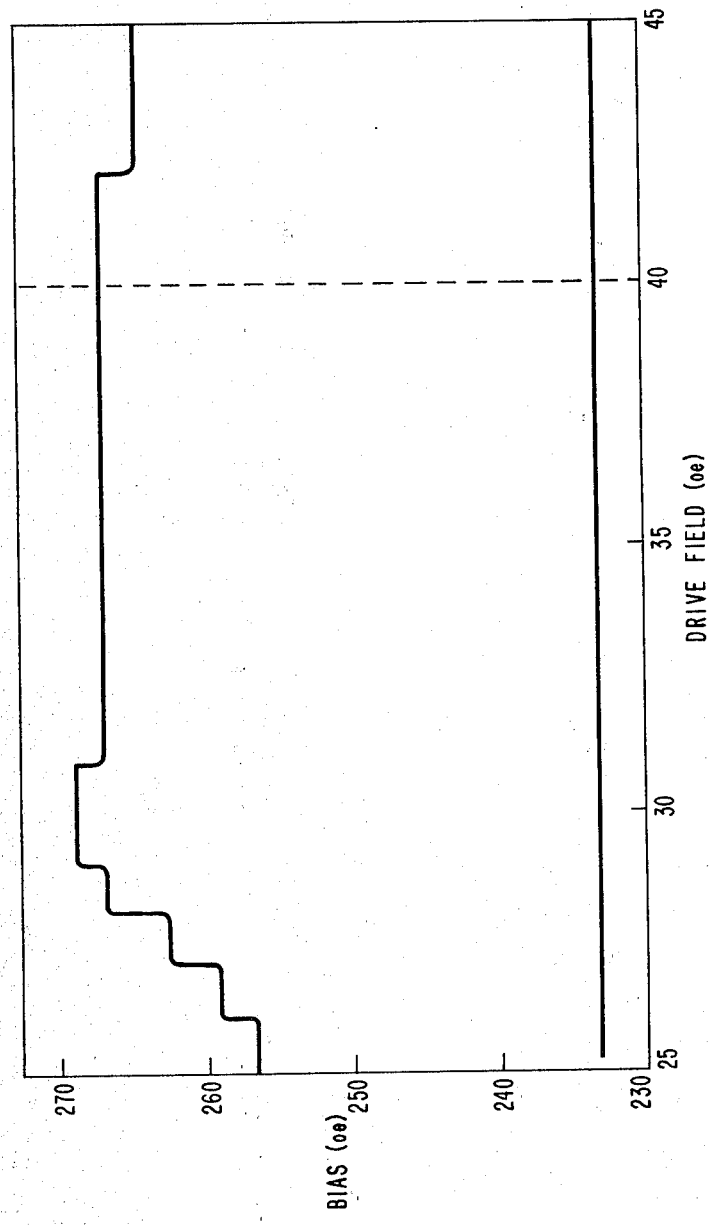

MAGNETIC BUBBLE DETECTOR

FIELD OF THE INVENTION

This invention relates to a detector for magnetic bubbles. More particularly, this invention relates to a nondestructive readout (NDRO) detector for magnetic bubbles.

BACKGROUND OF THE INVENTION

Magnetic bubble memories are well known in the art. A variety of detectors for bubbles also is known. Permalloy magnetoresistive detectors, for example, have been employed in commercially available bubble memories for bubble detection. One popular version of such a detector is disclosed in A. H. Bobeck, U.S. Pat. No. 3,810,132, issued May 7, 1974. That patent discloses an expander-detector arrangement operative to expand a bubble laterally with respect to the path of bubble propagation, to detect the expanded bubble, and to eliminate the detected bubble by movement to a guardrail. The guardrail structure and operation is shown in A. H. Bobeck, U.S. Pat. No. 3,729,726, issued Apr. 24, 1973. The latter patent also shows the organization of a bubble memory for operating in a major-minor mode. The major-minor organization for bubble memories was first disclosed in P. I. Bonyhard et al., U.S. Pat. No. 3,618,054, issued Nov. 2, 1971.

A bubble memory organized in a major-minor mode employs a plurality of closed minor loops in which bubbles circulate in response to a magnetic field reorienting in the plane of bubble movement. A major loop is formed adjacent the ends of the minor loop and includes a bubble generator and detector. Bubble transfer ports or replicate ports are formed between the major loop and the minor loops and are operative to move a bubble pattern to or from the minor loops on command as is now well understood.

We are concerned with the detector for bubbles and direct our attention primarily to a detector for an organization in which the major path is a loop operative to return bubbles to transfer ports at which they were first transferred from the minor loops. Such a loop arrangement permits the previously transferred (out) bubble pattern to be transferred (in) to vacancies in the minor loops created upon transfer out. A bubble memory including a major loop of this type conveniently employs an NDRO detector. An NDRO expander-detector employing permalloy is shown in A. H. Bobeck et al., U.S. Pat. No. 3,702,995, issued Nov. 14, 1972. Such a detector is employed within the major loop and is operative first to expand a bubble for detection and thereafter to contract the expanded bubble to its original size for continued movement in the major loop.

Permalloy expander-detectors have found commercial acceptance primarily because bubble propagation patterns also have been made of permalloy and the detector can be formed simultaneously with the propagation pattern as taught in W. Strauss, U.S. Pat. No. 3,609,720, issued Sept. 28, 1971. For nonpermalloy bubble memories, bubble expander-detectors can be made as well with electrical conductor patterns as taught in R. F. Fischer, U.S. Pat. No. 3,564,518, issued Feb. 16, 1971, because in such cases no processing advantage is gained by using permalloy detector arrangements. p Ion-implanted bubble memories also are well known. Such memories are first disclosed in M. Dixon et al., U.S. Pat. No. 3,792,452, issued Feb. 12, 1974. Ion-implanted memories also are organized in a major-minor mode. But a commercially suitable NDRO detector for ion-implanted bubble memories does not exist presently. The permalloy expander-detector described above cannot be used at present because of an incompatibility between a uniform ion implant required to suppress hard bubbles in a permalloy circuit (i.e., the expander-detector) and the uniform ion implant required to suppress hard bubbles in ion-implanted circuits. Further, the permalloy expander-detector requires entry from a permalloy track in turn requiring an ion-implanted to permalloy transition which is not available at present.

Conductor driven expander-detectors have been used experimentally to stretch a bubble laterally with respect to an originating path to couple a detector element arranged perpendicular to the path. But this type of detector has had deficiencies also. Particularly, with ion-implanted bubble memories, bubbles fail to remain in the originating path when destretched from the detector element. The problem addressed by this invention thus is the failure of ion-implanted magnetic bubble memories attributed to destretching of stretched bubbles for detection by an NDRO detector.

BRIEF DESCRIPTION OF ILLUSTRATIVE EMBODIMENTS OF THE INVENTION

The solution to this problem is to provide current-driven stretch and destretch pulses to at least two independently-driven conductor paths operative first to stretch between first and second positions in a bubble path a bubble moved to the first position for detection. Thereafter the bubble is destretched in a manner to ensure proper positioning at the second position after the detection operation. A detector element aligned with the conductors is operative to detect the stretch bubble and extends only part way between the first and second positions to permit a destretch pulse to remove the bubble from the element.

BRIEF DESCRIPTION OF THE DRAWINGS

FIG. 7 is a plot of bias margin versus rotating magnetic field for detector of FIG. 5.

DETAILED DESCRIPTION

Figure 1:
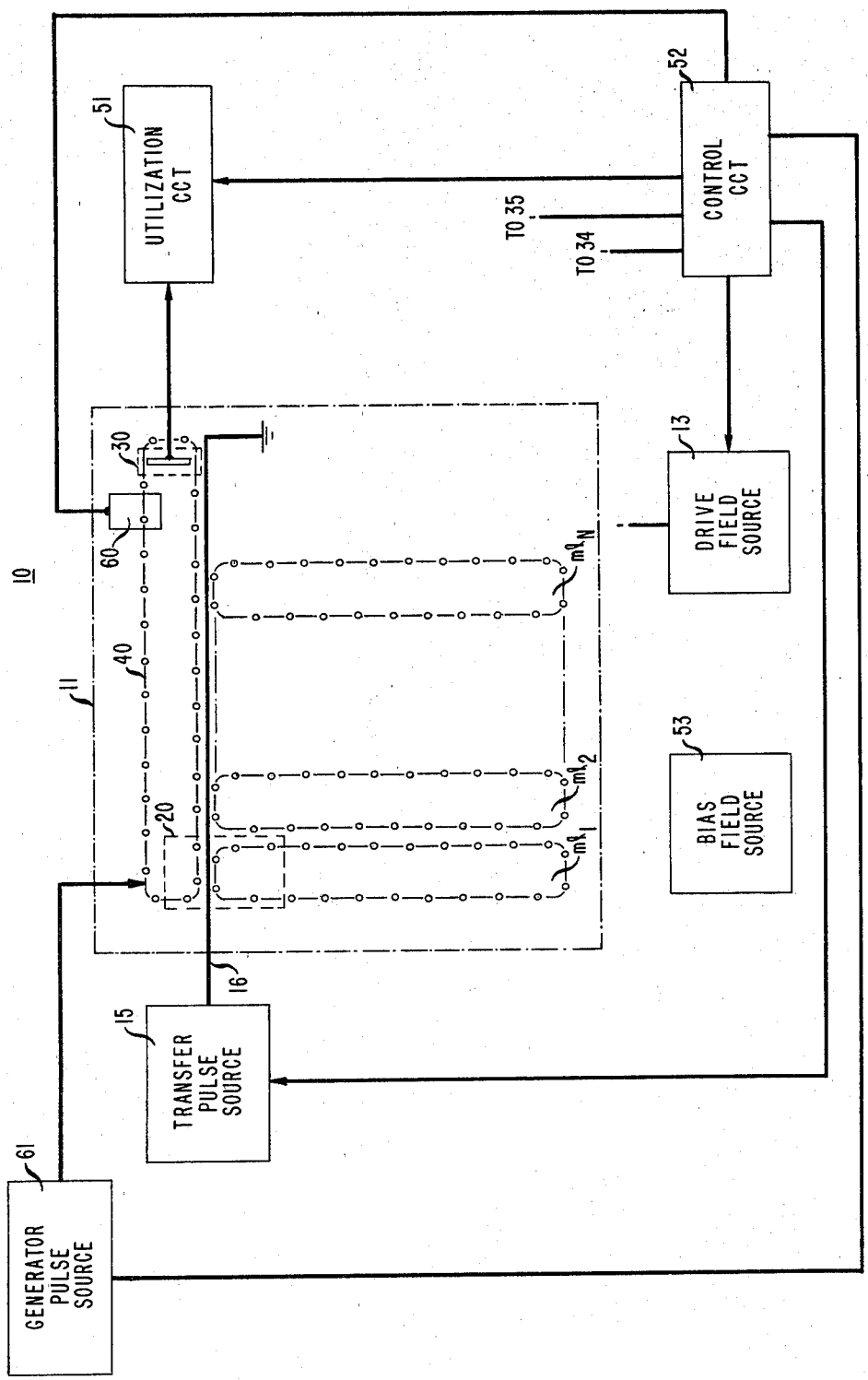
FIG. 1 is a schematic representation of a magnetic bubble memory in accordance with the invention.

FIG. 1 shows a magnetic bubble memory 10 including a layer of material 11 in which magnetic bubbles can be moved. The bubbles are moved along paths designated $ml_1 \ldots ml_N$ for minor loops 1–N and ML for the major loop in a well known major-minor memory organization. Bubble movement occurs in response to a magnetic field reorienting in the plane of layer 11. The reorienting field is supplied by drive field source 13.

The paths are defined by ion-implantation and the movement of bubble patterns to and from the minor loopsoccurs in response to a pulse applied by a transfer pulse source 15 to an electrical conductor 16 aligned along the positions where the ends of the minor loops are most closely space with respect to the major loop.

Figure 2:
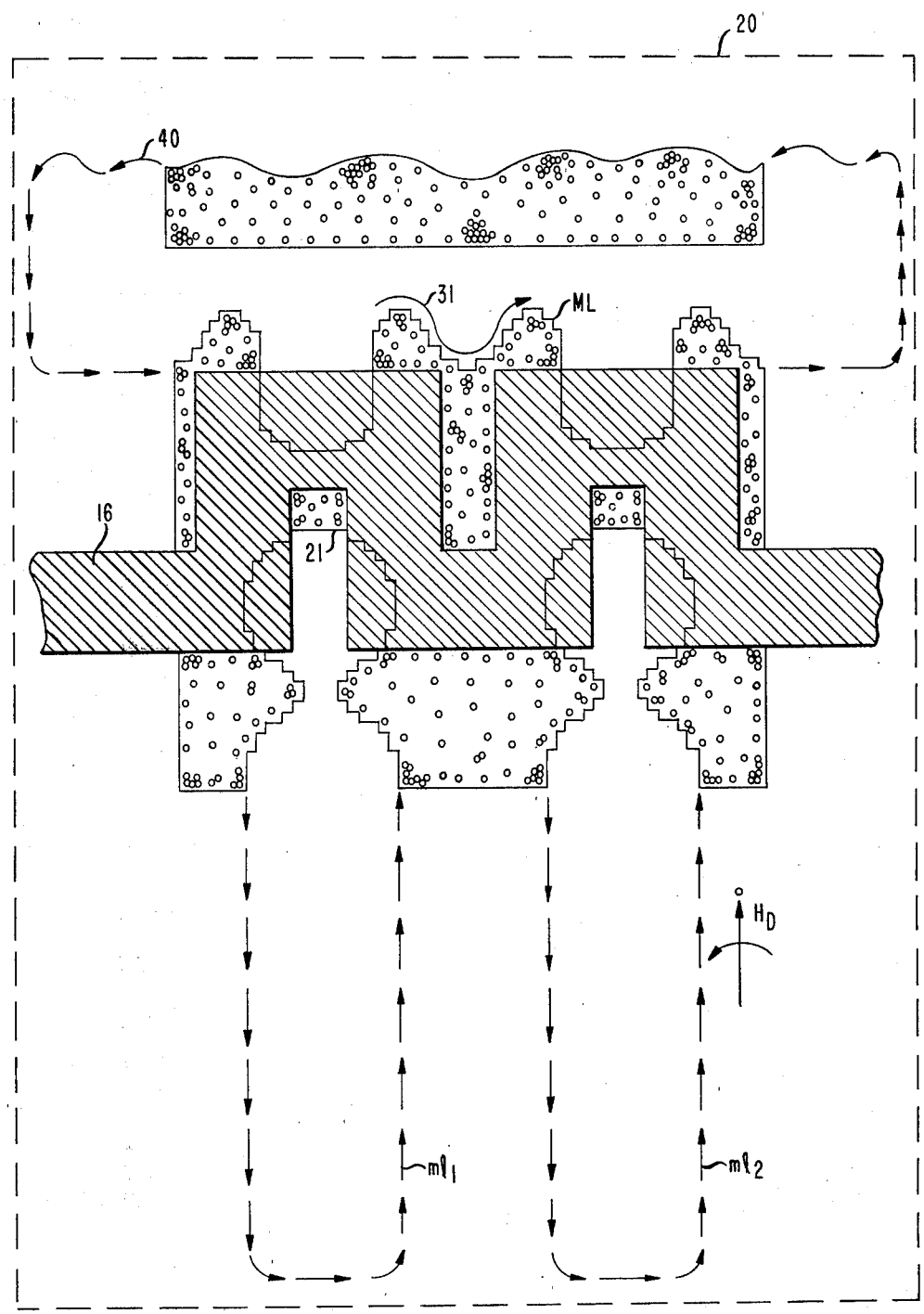
FIG. 2 is an enlarged schematic representation of a portion of the magnetic bubble memory of FIG. 1.

FIG. 2 shows the details of a portion 20 of the memory of FIG. 1 where minor loop $ml_1$ is closely spaced from the major loop. The stippled area is implanted and the bubbles move along the interface between the unimplanted and implanted areas. The bubbles move counter clockwise about loops $ml_1$ in response to a counter clockwise rotating in-plane field. Electrical conductor 16 is pulsed when the in-plane field $H_D$ is directed upwards as viewed in FIG. 2. At that time, a bubble pattern occupies positions in the minor loops similar to the representative position in the minor loop $ML_1$ designated 21 in FIG. 2. That bubble pattern is transferred to the major loop and moved to the right as viewed to output area 30 of FIG. 1.

Figure 3:
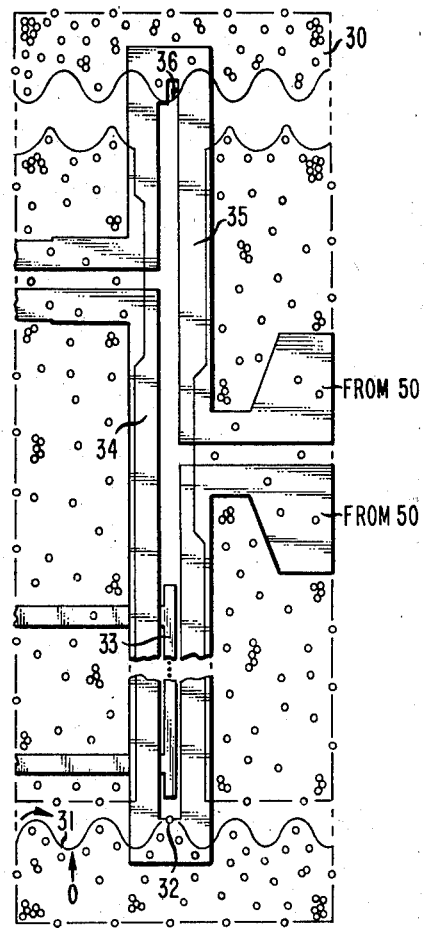
FIGS. 3 and 5 are enlarged top view of detectors useful for the memory of FIG. 2.

FIG. 3 shows the details of the detector portion of the output area 30. A bubble pattern transferred to the major loop from the minor loops during a read operation, moves to the right as indicated by curved arrow 31. The detector is operative to detect the presence or absence of bubbles (data) in consecutive reorientations of the in-plane field as the data occupies position 32 in FIG. 3. The ion-implanted area also is shown stippled in FIG. 3.

The detector comprises three elements. The first is a permalloy detection element 33 operative here as a magnetoresistive element to detect the presence of a bubble stretched from position 32. The other two elements are electrical conductors 34 and 35. Conductors 34 and 35 are pulsed together to stretch a bubble at position 32 during a stretch phase of the detection operation. Then conductor 34 is pulsed along to withdraw the bubble totally from the permalloy detection element and to ensure the presence of a bubble (once detected) at position 36. Position 36 is in the upper leg 40 of major loop ML as viewed in FIG. 1. In response to further reorientations of the in-plane field, the bubble pattern moves left as viewed in FIG. 1 (counter-clockwise) about the major loop.

Figure 4:
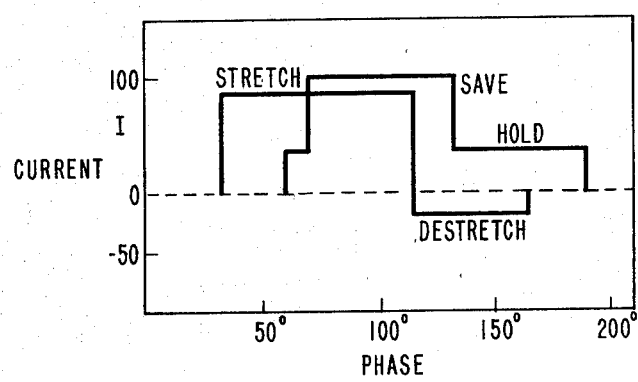
FIGS. 4 and 6 are pulse diagrams of the operation of the detectors of FIGS. 3 and 5 respectively.

FIG. 4 is a plot of current in milliamperes against direction of the in-plane (drive) field $H_D$. The Figure shows save and hold pulses applied to conductor 35 of FIG. 3 while, stretch and destretch pulses are applied to conductor 34. Field $H_D$ is in a zero direction (phase) where directed upward as viewed in FIG. 2. The save and stretch pulses are operative to stretch the bubble all the way from position 32 in FIG. 3 to position 36. The destretch pulse on conductor 34 removes the bubble from the permalloy detection element. The conductor 34 extends beyond the end of permalloy element 33 in order to avoid leaving the bubble attached to the permalloy at the termination of the destretch pulse.

Figure 5:
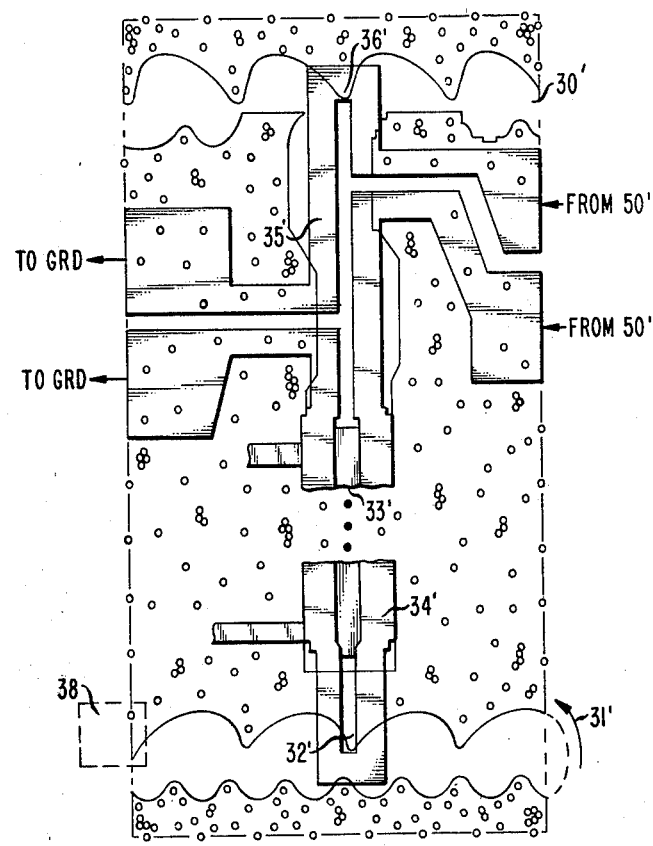

An alternative design to that of the arrangement of FIG. 3 is shown in FIG. 5. It is noted that the implanted region in the embodiment of FIG. 5 defines a nonstippled area which has a constant width, whereas that is not the case in the embodiment of FIG. 3. The constant width eliminates a problem relating to operational variations in the bias field when that width varies. This alternative design initiates a stretch operation when field $H_D$ is directed downwards and a bubble is in position 32'. Importantly, the field also is directed downward when the detect operation is complete and a bubble is in position 36'. It is clear that an entire cycle of the in-plane field is available for a detect operation in the embodiment of FIG. 5. An arrangement of this type has been operated at 100 kilohertz. The major path of the embodiment of FIG. 5 requires an additional partial loop in order to (define a downward facing cusp to) provide a position 32 from which to initiate the detect operation. Such a partial loop ends in an (active or passive) bubble annihilator represented by block 38. The various elements in FIG. 5 are designated to correspond to elements in FIGS. 1 and 3 but with an added prime indication.

Figure 6:
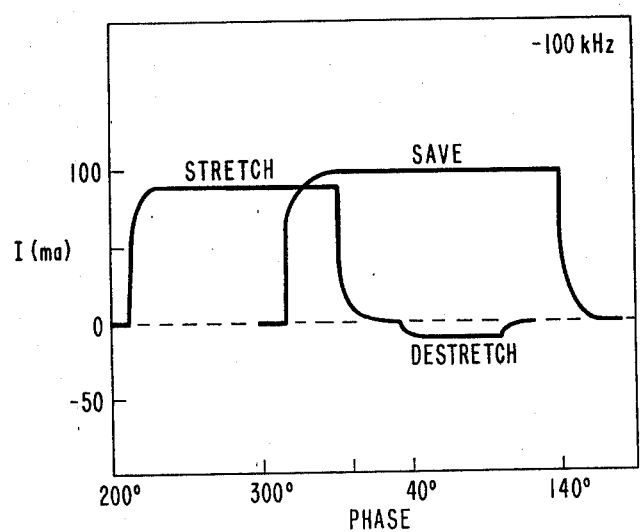

Operation of the embodiment of FIG. 5 is represented by the pulse diagram of FIG. 6. It can be seen that the various pulse forms in FIG. 6 can be supplied over a longer portion of the drive field cycle at 100 kilohertz indicative of improved margins. Further, only three pulses are employed for the embodiment of FIG. 6. In practice, a capacitor is provided in parallel electrically with each of conductors 34' and 35' in a manner to provide a ramp shape to the leading and trailing edges of the pulses as shown in FIG. 6.

FIG. 7 is a plot of bias field margins in oersteds versus drive field for the detector of FIG. 5. It is clear that the margin range stays nearly constant over a substantial drive field range.

During each detection operation, control circuit 50 of FIG. 1 applies the requisite pulses of FIGS. 4 and 6 to the conductor of FIGS. 3 and 5, respectively. During the stretch phase of each detection operation, the detection element applies a pulse (or the absence of a pulse) to utilization circuit 51 of FIG. 1 indicating the presence of a bubble during the instant cycle of the in-plane field. The operation including the supply of the transfer in and out pulses, the drive field, and the interrogate and output signals are synchronized and controlled by circuit 52. Bubble memory operation frequently requires replacement of stored information. In such instances, bubbles transferred out are annihilated and replaced by substitute data. To this end, path ML conveniently includes a (passive or active) bubble annihilator 60 and a bubble generator 61 operative under the control of control circuit 52 in a well-understood manner.

The operation of the memory occurs in the presence of a bias field supplied by a source represented by block 53 and operative to maintain the bubbles at a nominal diameter.

What has been described is considered merely illustrative of the principles of this invention. Therefore, it is possible for those skilled in the art to formulate various embodiments of this invention in accordance with those principles within the spirit and scope of the invention as encompassed by the following claims.

What is claimed is:

1. A magnetic bubble memory comprising a layer of material in which magnetic bubbles can be moved along at least a first path having spaced-apart first and second positions, a detection element extending from said first position along an axis aligned laterally with respect to the axis of said path and terminating short of said second position, first and second electrical conductors extending between said first and second positions, and means for selectively applying to said first and second conductors current pulses in a manner and for a time to first stretch a bubble in said first position along said detection element to said second position and thereafter to destretch said bubble from said detection element leaving said bubble at said second position.

2. A memory in accordance to claim 1 wherein said first path is a closed loop path and said detection element comprises permalloy.

3. A memory in accordance with claim 2 wherein said first path is defined by ion implantation.

4. A memory in accordance with claim 3 also including a plurality of second closed loop paths operative in parallel to move bubble patterns to transfer positions to said first path wherein said second paths also are defined by ion implantation.

5. A memory in accordance with claim 4 also including means for controllably moving bubble patterns between said first and said plurality of second closed loop paths.

6. A memory in accordance with claim 5 also including means for controllably generating a bubble pattern in said first path.

* * * * *